(12) United States Patent
Lunev et al.

(10) Patent No.: US 11,929,453 B2
(45) Date of Patent: Mar. 12, 2024

(54) LIGHT-EMITTING DIODE PACKAGE USING FLUID ENCAPSULATE

(71) Applicant: BOLB INC., San Jose, CA (US)

(72) Inventors: Alex Lunev, San Jose, CA (US); Ling Zhou, San Jose, CA (US); Jianping Zhang, San Jose, CA (US); Ying Gao, San Jose, CA (US); Huazhong Deng, San Jose, CA (US)

(73) Assignee: BOLB INC., Livermore, CA (US)

( * ) Notice: Subject to any disclaimer, the term of this patent is extended or adjusted under 35 U.S.C. 154(b) by 253 days.

(21) Appl. No.: 17/228,490

(22) Filed: Apr. 12, 2021

(65) Prior Publication Data
US 2022/0328729 A1    Oct. 13, 2022

(51) Int. Cl.
| H01L 33/48 | (2010.01) |
| H01L 33/52 | (2010.01) |
| H01L 33/56 | (2010.01) |
| H01L 33/58 | (2010.01) |
| H01L 33/62 | (2010.01) |
| H01L 33/64 | (2010.01) |

(52) U.S. Cl.
CPC .......... *H01L 33/486* (2013.01); *H01L 33/56* (2013.01); *H01L 33/58* (2013.01); *H01L 33/62* (2013.01)

(58) Field of Classification Search
CPC ....... H01L 33/486; H01L 33/62; H01L 33/58; H01L 33/60
See application file for complete search history.

(56) References Cited

U.S. PATENT DOCUMENTS

2022/0029065 A1 * 1/2022 Uratani ................... H01L 33/58
2022/0223767 A1 * 7/2022 Matsushima ......... H01L 33/382

FOREIGN PATENT DOCUMENTS

| CN | 213242589 U | * | 5/2021 | |
| JP | 2022021921 A | * | 2/2022 | ........... H01L 33/486 |
| JP | 2022098026 A | * | 7/2022 | |
| JP | 2022108692 A | * | 7/2022 | ........... H01L 33/382 |

* cited by examiner

Primary Examiner — Antonio B Crite
(74) Attorney, Agent, or Firm — J.C. PATENTS

(57) ABSTRACT

An UV or DUV light-emitting diode package includes: a foundation; a first metal layer, a second metal layer, and third metal layer formed on a top surface of the foundation, wherein the first metal layer and the second metal layer are electrically isolated by a first gap, the third metal layer surrounds the first and second metal layers and is electrically isolated from the first and second metal layers by a second gap; a lens attached to the top surface of the foundation, wherein a cavity is formed between the foundation and the lens; a chip disposed in the cavity, wherein an anode of the chip is electrically connected to the first metal layer and a cathode of the chip is electrically connected to the second metal layer; and a fluid encapsulate, wherein the cavity is fully or partially filled with the fluid encapsulate.

25 Claims, 14 Drawing Sheets

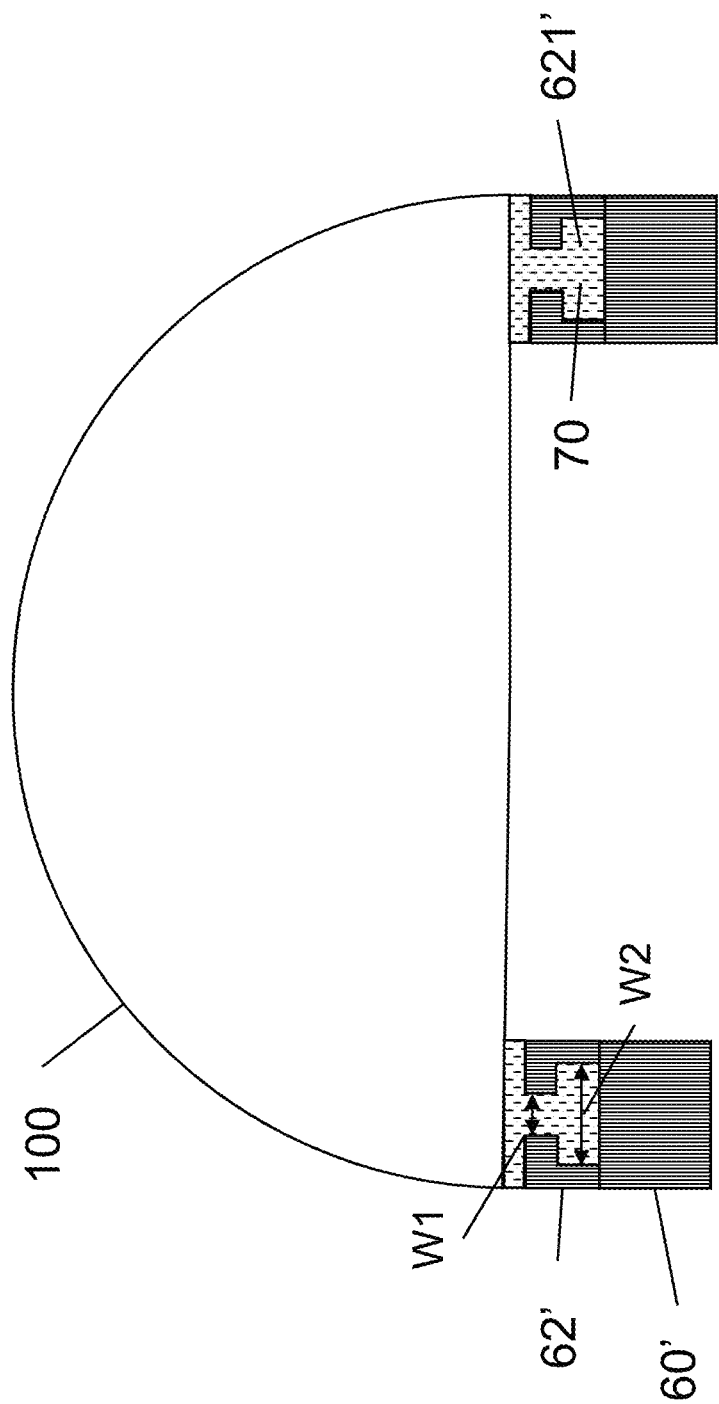

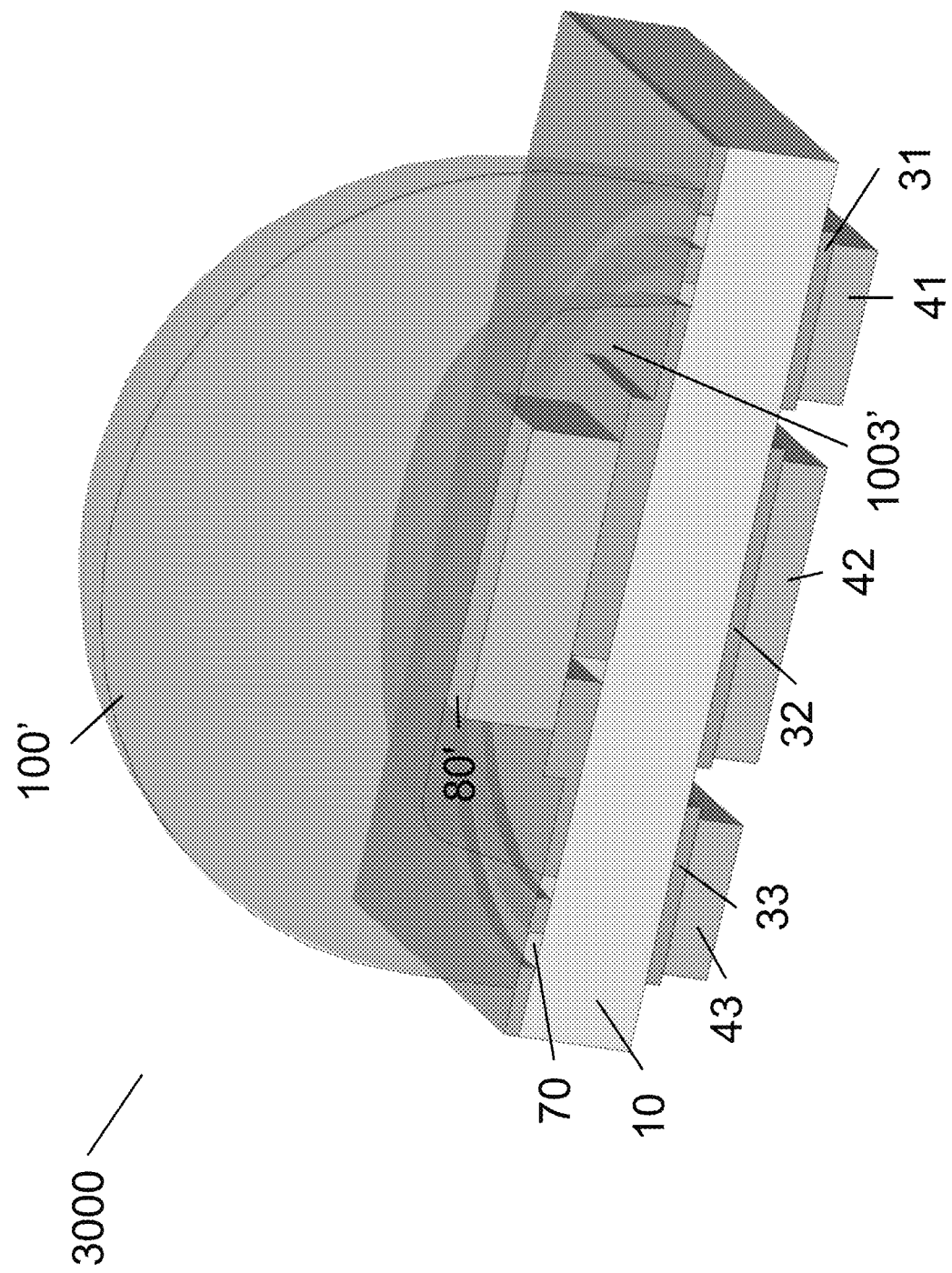

LIGHT-EMITTING DIODE PACKAGE USING FLUID ENCAPSULATE

FIELD OF THE INVENTION

The present disclosure relates to a light-emitting diode package using fluid encapsulate and, more particularly, to an ultraviolet or deep ultraviolet light-emitting diode package using a fluid encapsulate for improved reliability and light extraction.

DESCRIPTION OF THE RELATED ART

A light-emitting diode (LED) package usually includes an LED chip and a package housing the LED chip. The primary function of the package is to facilitate electrical connections between the LED chip and external circuits. The package in general also provides protection to the LED chip against mechanical and chemical hardship. A fine package shall also efficiently extract heat and light out of the LED chip. This is of crucial importance to short wavelength LEDs such as ultraviolet (UV) or deep ultraviolet (DUV) LEDs, where heat generation is severe and light extraction is inferior.

DUV LEDs in this specification are regarded as LEDs with peak emission wavelengths shorter than 350 nm, i.e., in the range of 200 nm to 350 nm, which are essentially made of high-Al-content AlGaN materials. For DUV LEDs of wavelengths shorter than 280 nm (i.e., into UV-C region), Al-content more than 60% is required for n- and p-AlGaN layers. Issues related to large electrical resistivity, high contact resistivity and strong polarization field are inevitable for high-Al-content AlGaN heterostructures. As a result, DUV LEDs made of AlGaN heterostructures generally suffer from additionally voltage penalty, and need package of reduced thermal resistance to extract heat more efficiently. Furthermore, as wavelength goes into UV-C range, light produced in the multiple-quantum-well (MQW) of the DUV LEDs includes significant portion of transvers magnetic (TM) mode. TM mode light tends to have large incident angle to the chip surface, usually larger than the critical light escape angle. This means that TM light is readily trapped inside the LED chip unless means is provided to enlarge the critical light escape angle. In the prior art, dome shaped lenses have been attached onto LED chips (or dice) to enhance light extraction efficiency of DUV LEDs, as disclosed in the US patent publication No. US20060138443 and U.S. Pat. No. 8,962,359. Further, the lens attachment substance (or adhesive) and the chip encapsulate are the same material in the prior art, usually made of UV transparent cured polymers such as polymethyl methacrylate (PMMA) or polydimethylsiloxane (PDMS or silicone). These encapsulates/adhesives can decay under DUV radiation, making the DUV LEDs subject to serious reliability issue.

Disclosed in the following are various embodiments of DUV LED packages, with improved thermal and light extraction efficiency as well as longtime reliability.

SUMMARY OF THE INVENTION

This disclosure provides a light-emitting diode package, including:
a foundation;
a first metal layer, a second metal layer, and third metal layer formed on a top surface of the foundation, wherein the first metal layer and the second metal layer are electrically isolated by a first gap, the third metal layer surrounds the first and second metal layers and is electrically isolated from the first and second metal layers by a second gap;
a lens attached to the top surface of the foundation, wherein a cavity is formed between the foundation and the lens;
a LED chip disposed in the cavity, wherein an anode of the chip is electrically connected to the first metal layer and a cathode of the chip is electrically connected to the second metal layer; and
a fluid encapsulate, wherein the cavity is fully or partially filled with the fluid encapsulate.

BRIEF DESCRIPTION OF THE DRAWINGS

The accompanying drawings, which are included to provide a further understanding of the invention and constitute a part of this application, illustrate embodiments of the invention and together with the description serve to explain the principle of the invention. Like reference numbers in the figures refer to like elements throughout, and a layer can refer to a group of layers associated with the same function.

FIG. 3C shows a cross-sectional illustration on lens attachment according to an embodiment of this disclosure.

FIG. 5C shows a perspective cross-sectional view of the deep UV LED shown in FIG. 5B.

DETAILED DESCRIPTION OF EMBODIMENTS

In the following description, for the purposes of explanation, specific details are set forth in order to provide an understanding of the disclosure. It will be apparent, however, to one skilled in the art that the disclosure can be practiced without these details. One skilled in the art will recognize that embodiments of the present disclosure, described below, may be performed in a variety of ways and using a variety of means. Those skilled in the art will also recognize additional modifications, applications, and embodiments are within the scope of this disclosure, as are additional fields in which the disclosure may provide utility. Accordingly, the embodiments described below are illustrative of specific embodiments of the disclosure and are meant to avoid obscuring the disclosure.

According to an aspect of the present disclosure, a DUV LED is provided including at least a DUV LED chip, a lens, lens attachment (sealant or adhesive), and chip encapsulate. The lens is substantially rigid (solid), can be a flat DUV transparent window, or have part being of spherical or dome shape, or any other suitable shape. The encapsulate is not rigid or solid. In some embodiments, the encapsulate can be fluid or liquid, in other embodiments the encapsulate can be grease or gel. Optionally, both the lens and the encapsulate are DUV transparent, with DUV refractive indexes optionally higher than 1.3. The lens attachment, optionally being DUV transparent, reflective, or absorptive, can be an elastomer upon curing, capable of reversible extension by more than 10%, e.g., 100-1000%, upon exertion or relaxation of an external force. More specifically, reversible extension as used here means the lens attachment can be compressed or stretched in a direction without deteriorate its material properties such as mechanical strength, hermicity and elasticity.

Figure 1A:
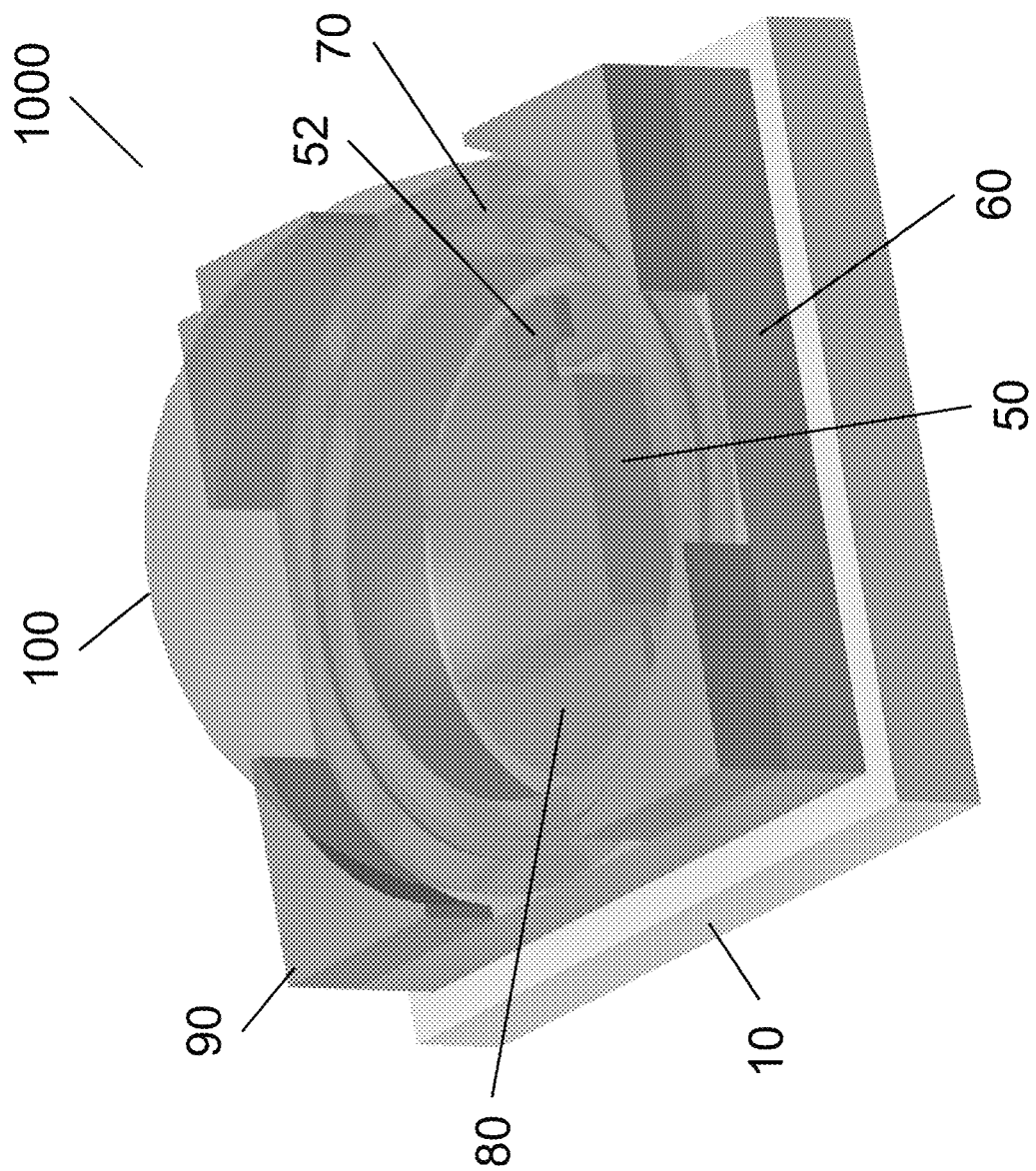
FIG. 1A shows a top perspective view of a deep UV LED according to one aspect of this disclosure.
Figure 1B:
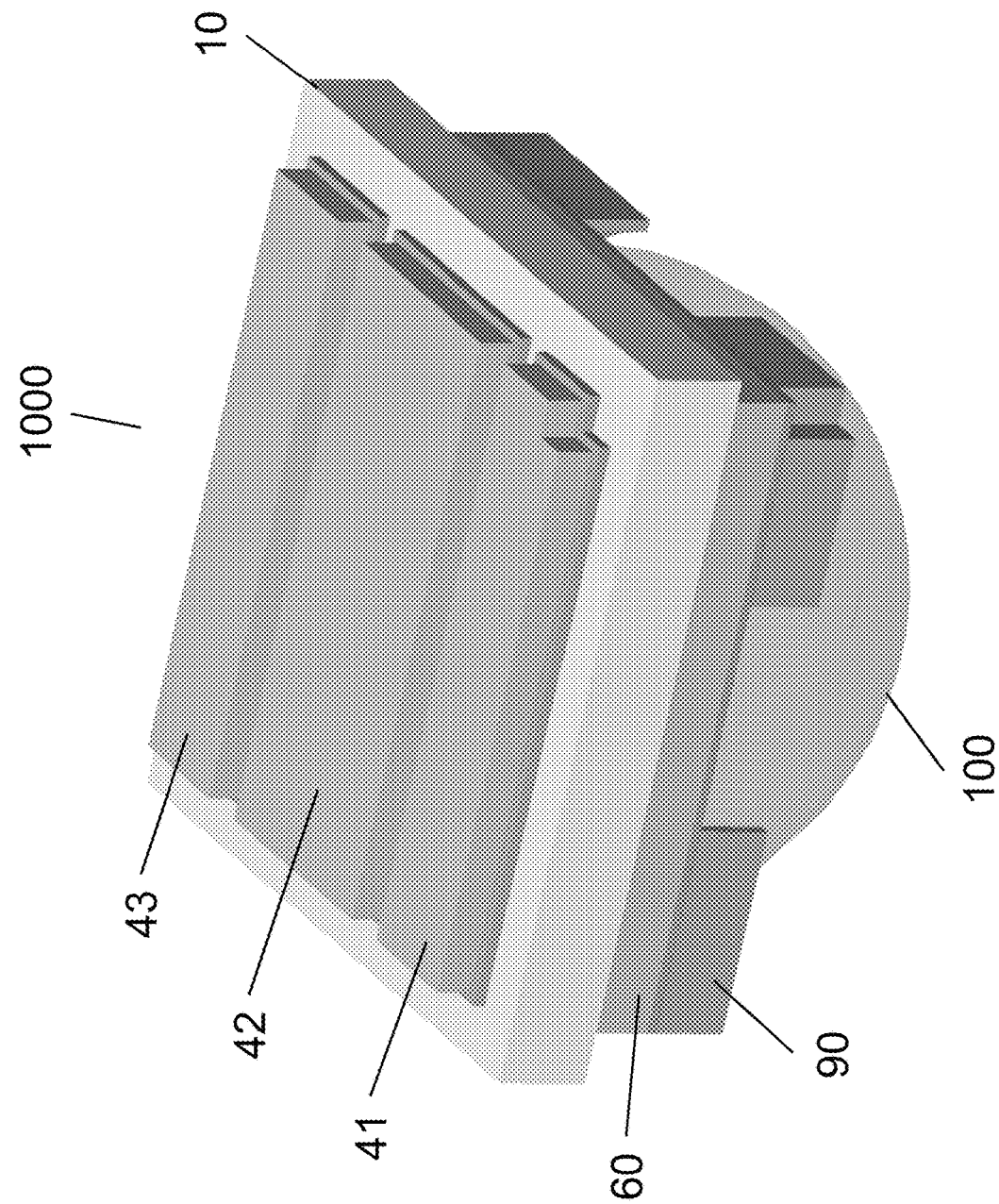
FIG. 1B shows a bottom perspective view of a deep UV LED according to an embodiment of this disclosure.
Figure 1C:
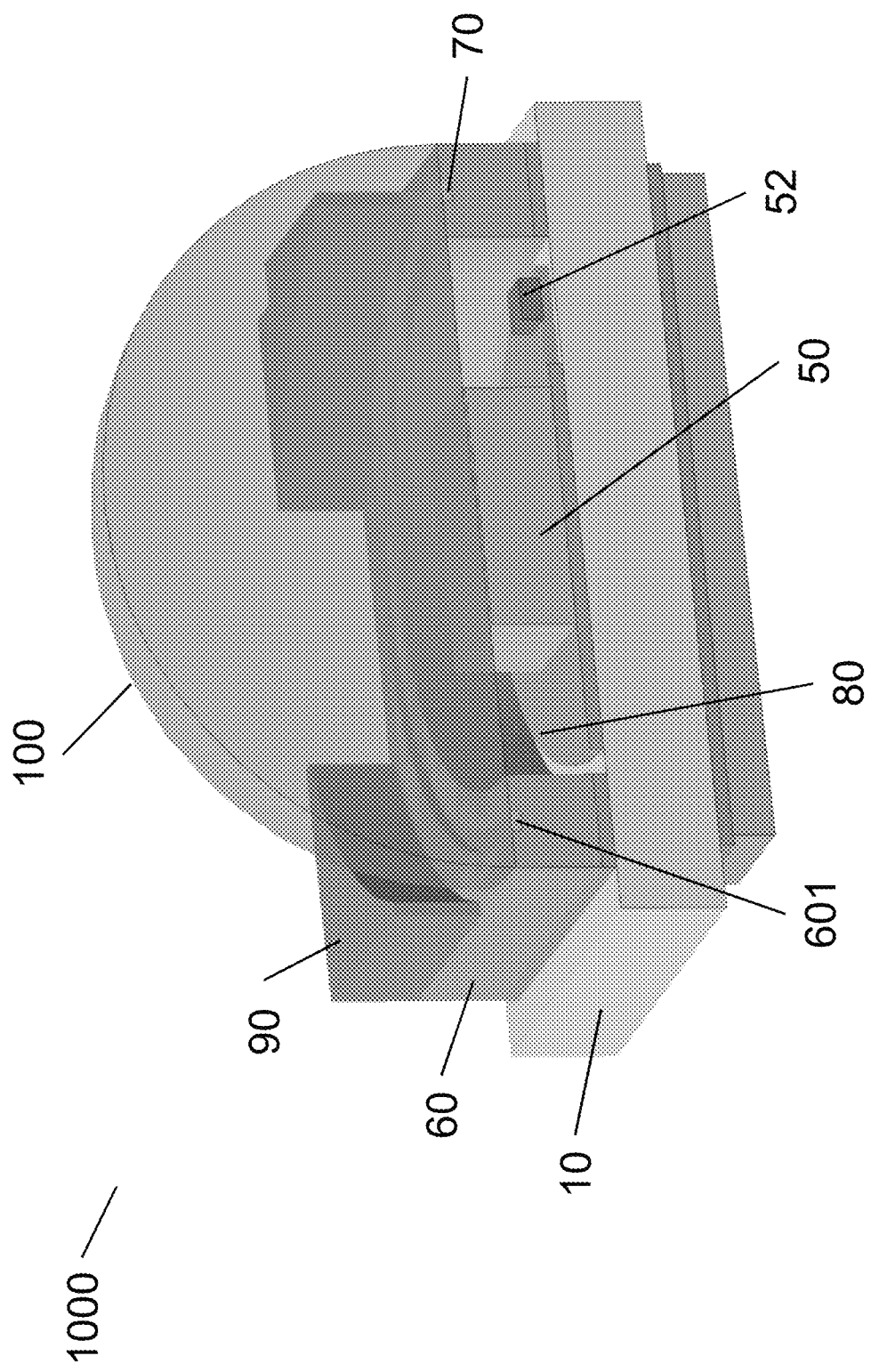
FIG. 1C shows a cross-sectional perspective view of a deep UV LED according to an embodiment of this disclosure.
Figure 1D:
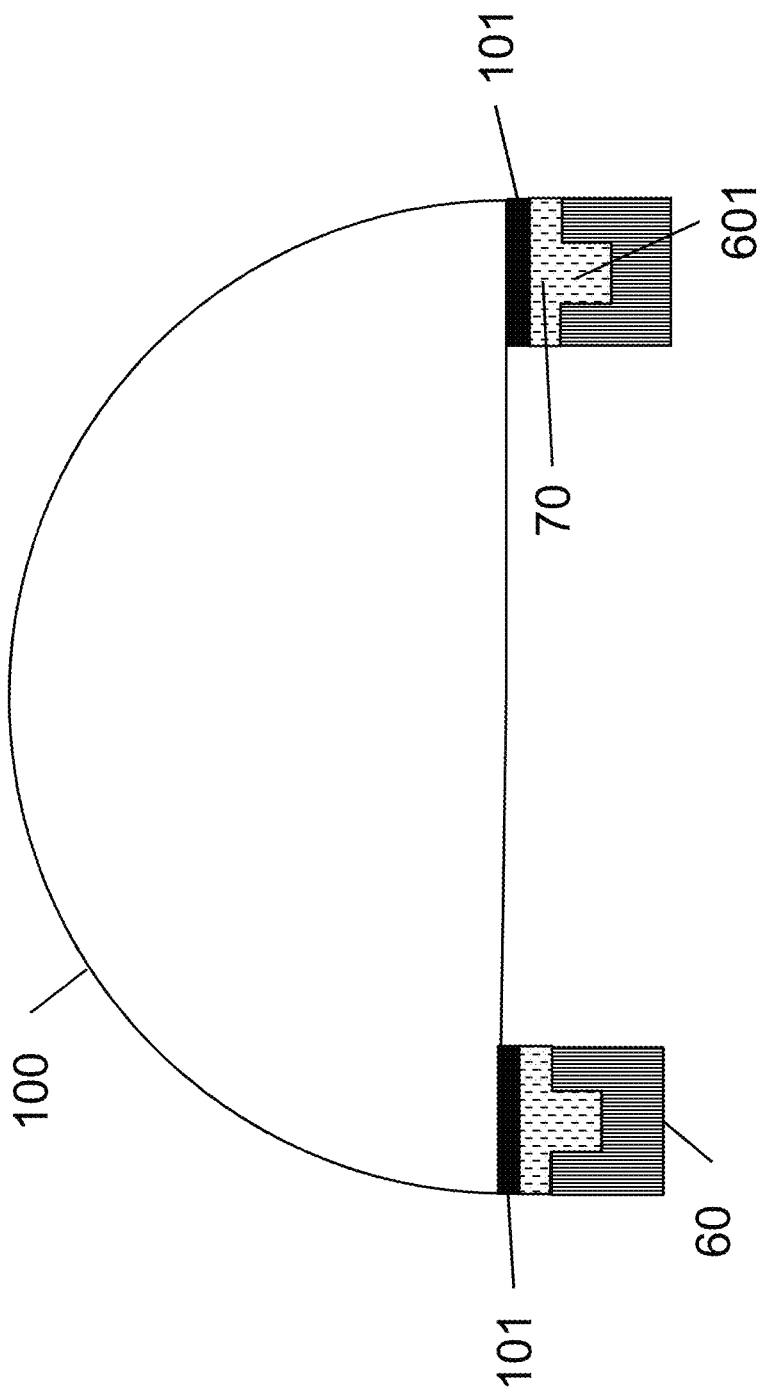
FIG. 1D shows a cross-sectional illustration on lens attachment according to an embodiment of this disclosure.
Figure 1E:
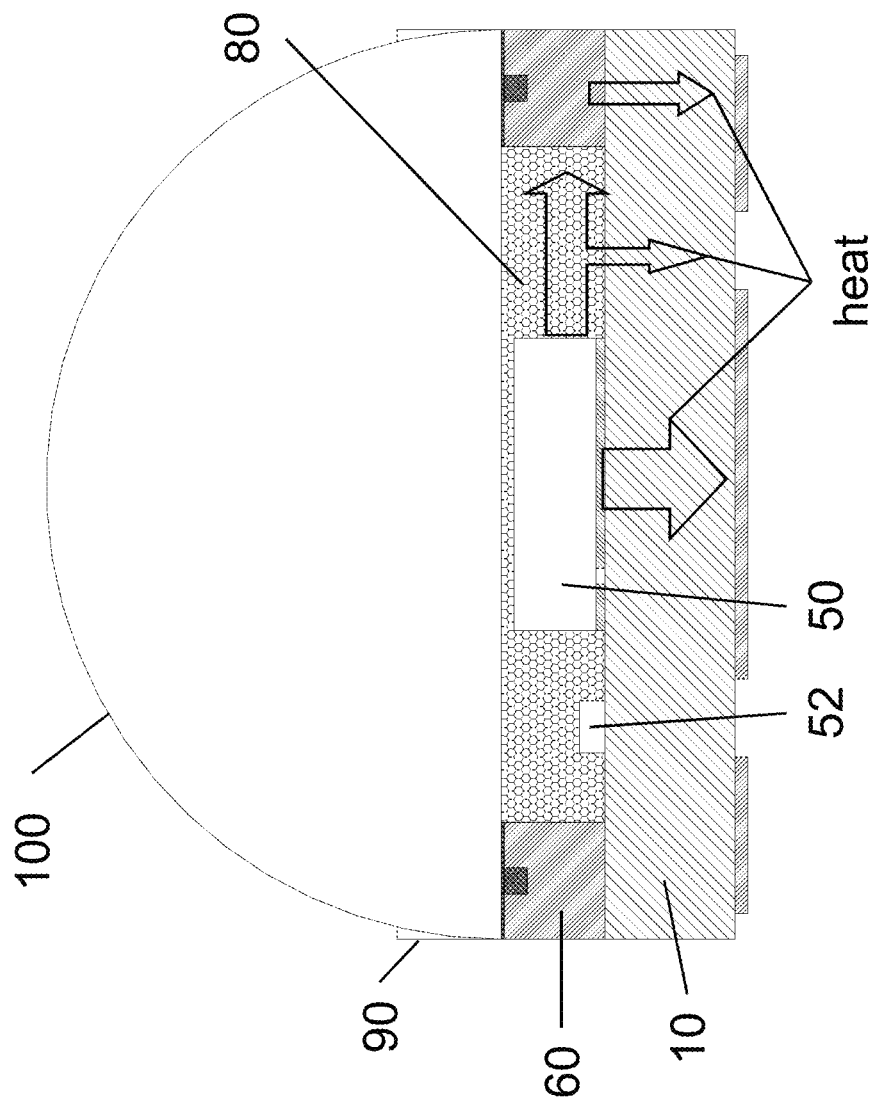
FIG. 1E shows a cross-sectional illustration of a deep UV LED according to an embodiment of this disclosure.
Figure 1F:
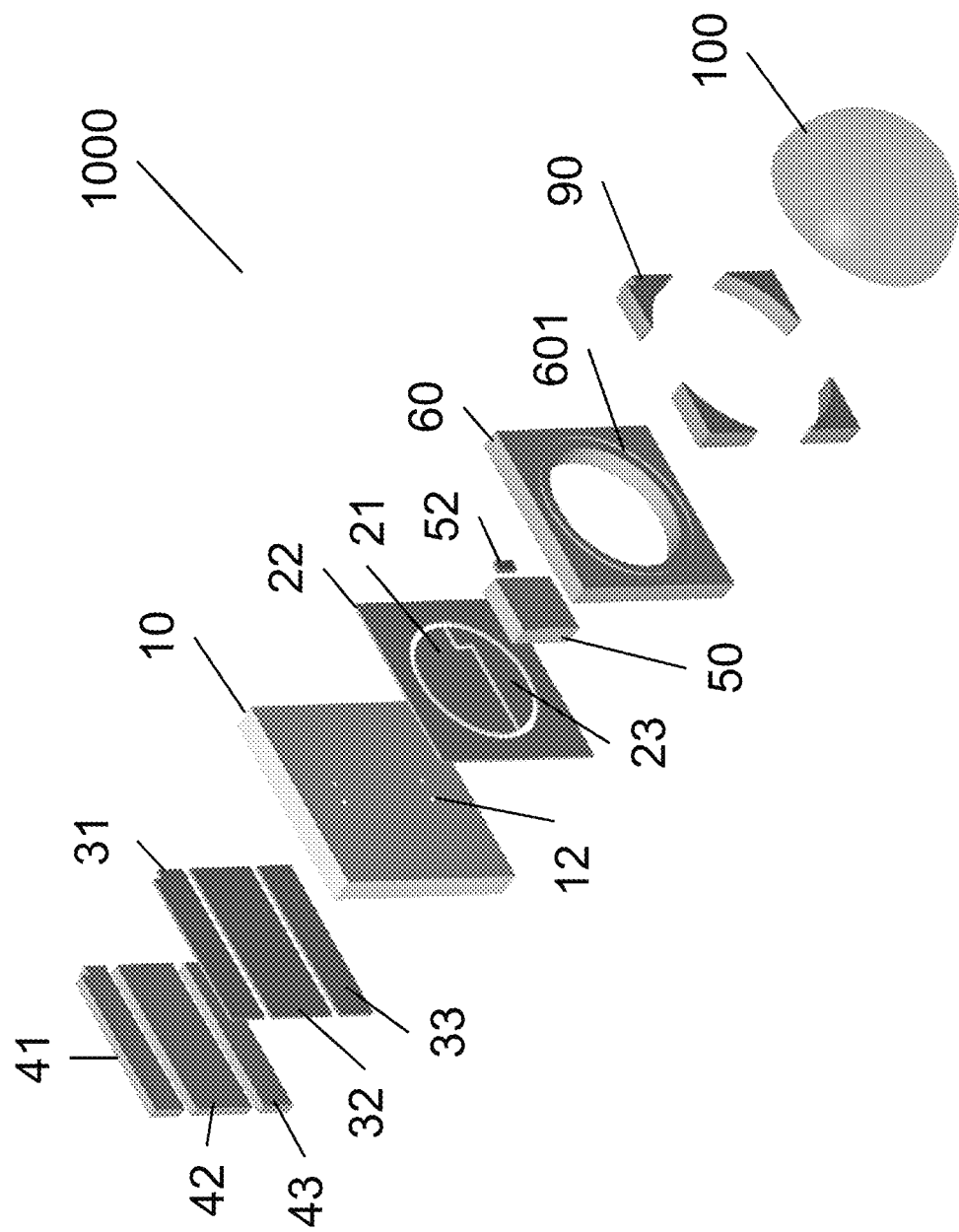
FIG. 1F shows an exploded view of a deep UV LED according to an embodiment of this disclosure.

One embodiment of a DUV LED 1000 package according to the present disclosure is shown in FIGS. 1A-1F. This is a surface mount device (SMD). FIGS. 1A, 1B and 1F are top, bottom perspective views and exploded view of DUV LED 1000, respectively. The foundation of DUV LED 1000 is a submount 10, which can be an insulating ceramic body of high thermal conductivity. In one embodiment, submount 10 can be an AlN ceramic body of thickness ~500 µm with thermal conductivity above 100 W/m-K, e.g., 130-320 W/m-K. In other embodiments, the foundation of DUV LED 1000 can be a printed circuit board (PCB) or a metal core printed circuit board (MCPCB) to form a chip-on-board (COB) LED as described later in more details, or can be other suitable bases. Detailly disclosed in the following are DUV LED embodiments based on ceramic submount 10, as examples to elucidate the principles of the present disclosure. As seen, metal layers 21, 22, and 23 can be formed on a top surface of submount 10 side-by-side, and are electrically isolated from each other by gaps formed in-between them. Metal layers 21, 22, and 23 can be of the same composition and thickness, for example, they can be a 50-100 µm thick (such as 65 µm) metal layer made of copper, gold tin, or gold layer. In one embodiment, metal layers 21, 22, and 23 are formed via electroplating, made of 65 µm copper coated with 4 µm nickel and ~100 nm gold. The gaps formed in-between them can be of width 60-150 µm (such as 100 µm) and height the same as the thickness of the metal layers. In the DUV LED 1000, metal layers 21 and 23 serve as anode and cathode, to receive (contact) the anodes and cathodes of DUV LED chip 50 and electrostatic discharge (ESD) diode 52, respectively. ESD diode 52 can be a Zener diode or a pair of Zener diodes, which will turn on to shunt current and protect DUV LED chip 50 if undesired high voltage spikes occur due to electrostatics or power surge. Metal layer 22 can be used to bond to pedestal 60.

Formed on the bottom surface of submount 10 are metal contacts 31-33. Metal contacts 31 and 33 are electrically connected to metal layers 21 and 23, respectively, via metal through vias 12 formed in submount 10. Metal contacts 31-33 can be of the same thickness and metal as metal layers 21-23. Metal contact 32 is not biased, serving as a thermal pad, together with bond pad 42 formed thereon, to conduct heat. Metal contacts 31-33 are electrically isolated from each other by gaps of width 100-200 µm, such as 170 µm. Formed on metal contacts 31-33 are bond pads 41-43, respectively. Therefore, bond pads 41 and 43 are electrically connected to the anodes and cathodes of DUV LED chip 50 and ESD diode 52, respectively. Bond pads 41-43 are to be soldered to a circuit board and can be made of copper, gold tin, gold, or tin with a thickness 150-250 µm, such as 200 µm. In one embodiment, bond pads 41-43 are formed via electroplating, made of 200 µm copper coated with 4 µm nickel and ~100 nm gold. Bond pads 41-43 are electrically isolated from each other by gaps of width 100-300 µm, such as 270 µm.

Formed on metal layer 22 is pedestal 60, which can be a metal (such as copper coated with aluminum) ring with a central opening enclosing DUV LED chip 50 and ESD diode 52. Pedestal 60 can be bonded or electroplated on metal layer 22. Pedestal 60 can be of a height (vertical dimension) 200-500 µm, such as 360 µm, a width (the ring's circumference width or lateral dimension) 400-600 µm, such as 450 µm. The inner sidewall of the central opening of pedestal 60 enclosing DUV LED chip 50 can be DUV reflective and have a slanted angle relative to the top surface of submount 10, so that light emitted from the edge of DUV LED chip 50 can be reflected upwardly. On the top surface of pedestal 60 there may be a notch 601, of a depth 40-60 µm, such as 50 µm and a width 80-120 µm, such as 100 µm. A few (e.g., 4) pieces of braces 90 are formed on the top surface of pedestal 60, helping to position lens 100 sitting on top of pedestal 60 in-between braces 90. Braces 90 can be made of copper and coated with DUV reflective metal such as aluminum, of a height 100-500 µm, such as 200-400 µm. Lens 100 is substantially rigid (solid), can be a flat DUV transparent window, or have part being of spherical or dome shape (as shown in FIGS. 1A-1F). Lens 100 can be made of DUV transparent materials such as fused silica, quartz, sapphire, AlN, CYTOP (CYTOP is the registered trademark of AGC Inc. (formerly Asahi Glass Co., Ltd.)), and TEFLON amorphous fluoropolymer (AF) et al.

According to another aspect of the present disclosure, encapsulate 80, as shown in FIGS. 1A, 1C, and 1E, is in liquid, grease or gel state, fully immersing DUV LED chip 50 and ESD diode 52 and completely fulfilling the cavity defined by submount 10, pedestal 60 and lens 100. Encapsulate 80 is preferred to be of large viscosity (optionally in the range of 100-2000 cSt at ° C.), suitable surface tension (optionally in the range of 10-100 dyne/cm at 20° C.) and small vapor pressure (optionally in the range of $10^{-4}$-$10^{-8}$ torr at 100° C.). According to the present disclosure, the main constituent of encapsulate 80 is perfluoropolyether (PFPE) oil, with a chemical formula: $F-(CF(CF_3)-CF_2-O)_n-CF_2CF_3$, where the degree of polymerization, n, generally lies within the range of 10 to 60. These compounds are collectively known by many names including, PFPE, perfluoroalkylether (PFAE) and perfluoropolyalkylether (PFPAE). PFPE oils in general are used as lubricant, can be commercially available under the trademarks Fomblin and Krytox, such as Fomblin Y LVAC and HVAC grade oils, Krytox oils GPL 107 and XP1A7, et al. Krytox is a registered trademark of the Chemours company, and Fomblin is a name brand fluoropolymer produced by Solvay Specialty Polymers S.P.A. Some Fomblin oils and Krytox oils GPL 107 and XP1A7 are DUV transparent and chemically and thermally stable, of DUV refractive index larger than 1.3. Therefore, Fomblin oils and Krytox oils GPL 107 and XP1A7 are suitable material for encapsulate 80. Encapsulate 80 can also be PFPE oil doped with nanoparticles (50-200 nm) of $SiO_2$, $Al_2O_3$, $MgF_2$, $CaF_2$, TEFLON amorphous fluoropolymer, polytetrafluoroethylene (PTFE), amorphous fluoropolymer CYTOP et al, of particle volume concentration 3-20 vol. %. When nanoparticle volume concentration increases, encapsulate 80 changes from liquid oil to transparent grease. These doped nanoparticles are DUV transparent and have higher DUV refractive indexes than that of PFPE oils, can improve light extraction efficiency of encapsulate 80.

The cavity holding encapsulate 80 and defined by submount 10, pedestal 60 and lens 100 is preferably hermetic, i.e., airtight. This is achievable as pedestal 60 is bonded or electroplated on metal layer 22 and lens 100 is attached on pedestal 60 using hermetic lens attachment 70. As seen from FIGS. 1C and 1D, lens attachment 70 is applied on the top surface of pedestal 60, especially in notch 601. When a force is exerted to lens 100 towards pedestal 60, lens attachment 70 will be compressed and spreads out uniformly. Upon curing (thermal or UV), lens attachment 70 will secure lens 100 hermetically on pedestal 60. Notch 601 helps to spread out lens attachment 70 more uniformly and enhance the mechanical strength and hermeticity as the part of lens attachment 70 in notch 601 is thicker and more stretchable.

As encapsulate 80 is non-solid, it tends to have thermal expansion coefficient larger than solids such as pedestal 60 and lens 100. For example, encapsulate PFPE oils can have thermal expansion coefficient around $100\text{-}400 \times 10^{-6}/° C.$, which is about more than 10 times of those of most solids. To accommodate the thermal expansion difference between encapsulate 80, pedestal 60 and lens 100, according to another aspect of this disclosure, lens attachment 70 upon curing is an elastomer which can be reversibly extended by more than 10%, for example, 100-1000%, upon exertion or relaxation of an external force. Lens attachment 70 can be made from polydimethylsiloxane (PDMS or silicone). Cured silicones are very durable elastomers. Lens attachment 70 can be DUV transparent, reflective, or absorption. To be DUV reflective or absorptive, lens attachment 70 made of silicone can be doped with DUV reflective nanoparticles such as TEFLON, CYTOP, Al, or DUV absorptive nanoparticles such as carbon. Being DUV absorptive or reflective can reduce the aging effect of lens attachment 70 under DUV radiation. Alternately, as shown in FIG. 1D, DUV reflective coating 101, such as aluminum film, can be applied to the lens attachment area of lens 100 to protect lens attachment from DUV light exposure.

Furthermore, seen from FIG. 1E, as encapsulate 80 is fluidic, it can fill up all possible air gaps or voids between DUV LED chip 50 and submount 10. This makes DUV LED 1000 superior in light extraction as well as heat extraction. Besides being conducted directly from DUV LED chip 50 to submount 10, heat can also be readily transferred from DUV LED chip to pedestal 60 (which is a big metal piece), resulting in even less thermal resistance of DUV LED 1000.

Figure 2:
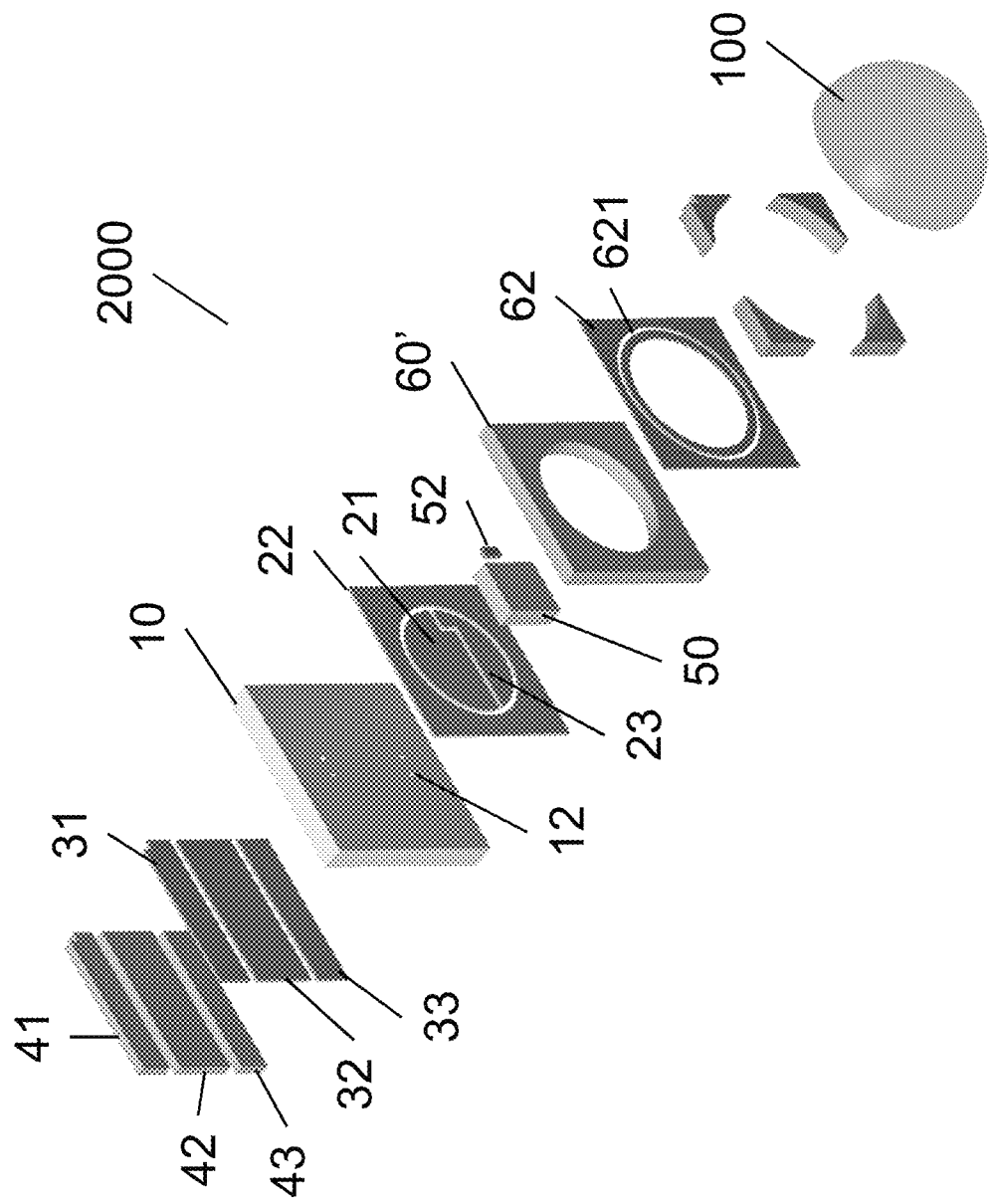
FIG. 2 shows an exploded view of a deep UV LED according to an embodiment of his disclosure.

DUV LED 2000 shown in FIG. 2 is similar to DUV LED 1000, with a difference in the pedestal. Pedestal 60' of DUV LED 2000 does not have a notch and is spaced away from lens 100 by a gasket 62 which has a notch 621 on its top surface. Notch 621 may have similar dimensions as notch 601. In some embodiments, notch 621 does not penetrate gasket 62. In other embodiments, notch 621 may partially penetrate gasket 62, or completely penetrate gasket 62 to divide gasket 62 into two separate parts. During assembly, gasket 62 is formed on pedestal 60' and lens attachment 70 is applied on gasket 62 and notch 621.

Figure 3B:
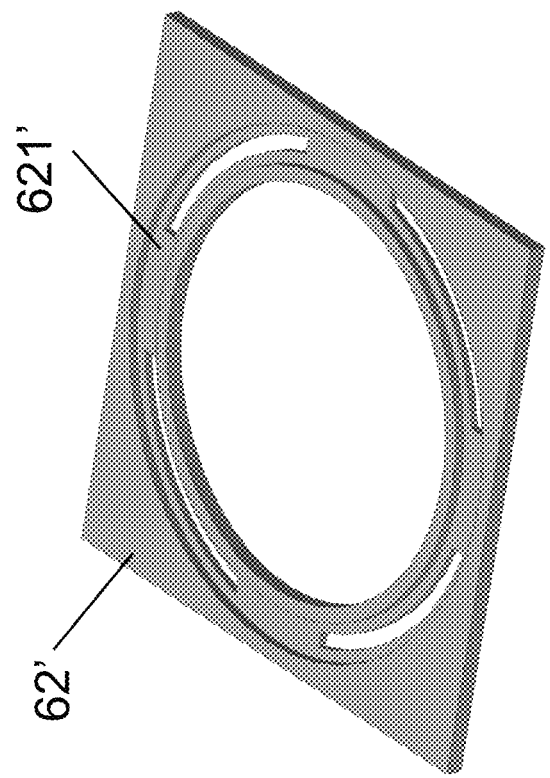
FIG. 3B shows a bottom perspective view of a lens attachment gasket according to an embodiment of this disclosure.
Figure 3A:
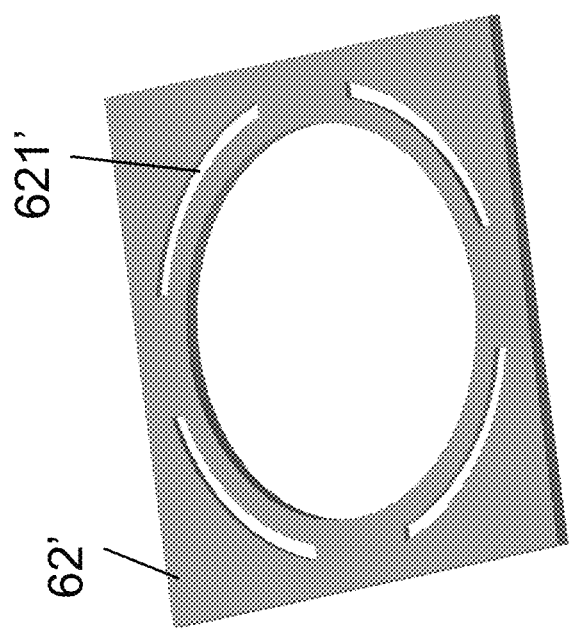
FIG. 3A shows a top perspective view of a lens attachment gasket according to an embodiment of this disclosure.

Gasket 62 can also be of other designs. For example, gasket 62 can be replaced by gasket 62', which has a structured notch 621' as shown in FIGS. 3A-3C. As seen from the top and bottom perspective views of gasket 62' (FIGS. 3A and 3B, respectively), notch 621' on the bottom surface (the side to be bonded to pedestal 60') of gasket 62' is a groove continuously surrounding the central opening of gasket 62' and, within the groove, only segmented areas (four segments as shown) with a narrower width than that of the groove open to or penetrate the top surface (the side to receive lens 100) of gasket 62'. Referring to the schematic cross-sectional illustration FIG. 3C, the width W1 of the opened segmented areas of notch 621' in the top side can be about one to three quarters of the width W2 of the groove of the notch 621' in the bottom side. For example, gasket 62' can be of a width 400-500 μm, such as 450 μm and a height about 50-150 μm (e.g., 100 μm). And notch 621' can be of a height 50-150 μm (e.g., 100 μm), with top opening width W1 about 25-50 μm and bottom notch width W2 about 50-100 μm. Comparing FIG. 3C to FIG. 1D, one can expect that DUV LEDs with structured notch 621' can accommodate more stretchable lens attachment 70 as compared to DUV LEDs 1000 and 2000.

Experimentally, DUV LEDs with peak wavelength at 272 nm were packaged according to the disclosure given above. Square type AlN ceramic bodies of dimensions 3.9 mm×3.9 mm×0.5 mm were used as submount (10) (hence the package is called SMD3939). Metal layers 21, 22, and 23 were 65 μm thick copper coated with 4 μm nickel and 100 nm gold. Metal contacts 31-33 were 65 μm thick copper. Metal contacts 31 and 33 were electrically connected to metal layers 21 and 23, respectively, each via three copper through vias (12) of diameter of microns. Bond pads 41-43 were 200 μm thick copper layer coated with 4 μm nickel and 100 nm gold. Pedestal 60 was a 360 μm thick copper layer of width 450 μm. Notch 601 was of depth ~50 μm and width ~100 μm. Braces 90 formed on the top surface of pedestal 60 were made of 400 μm-thick copper. Most of the metal layers (except for the plating seeding layer) or structures were formed by lithography and electroplating. 272 nm LED chips (50) were flip-chip bonded onto the AlN ceramic submounts (10) so that the chip anodes and cathodes were bonded to metal layers 21, and 23, respectively. Krytox GPL 107 oil was used as encapsulate (80), hemispherical quartz lens of diameter of 3.5 mm was used as lens (100), and SYLGARD™184 (Sylgard is a Dow Corning brand) silicone (two parts) was used as elastomer lens attachment (70). The lens attachment silicone was thermally cured at 150° C. for about 10 minutes. These LEDs were then put under electrical stress of direct current 350 mA to check the reliability of the package, especially the reliability of Krytox GPL 107 oil and SYLGARD™184 silicone lens attachment elastomer under strong DUV radiation. The DUV intensity experience by the encapsulate was estimated to be very strong, with the strongest to be at the proximity of the DUV LED chip surface, as high as $10^4$ mW/cm$^2$.

Figure 4:
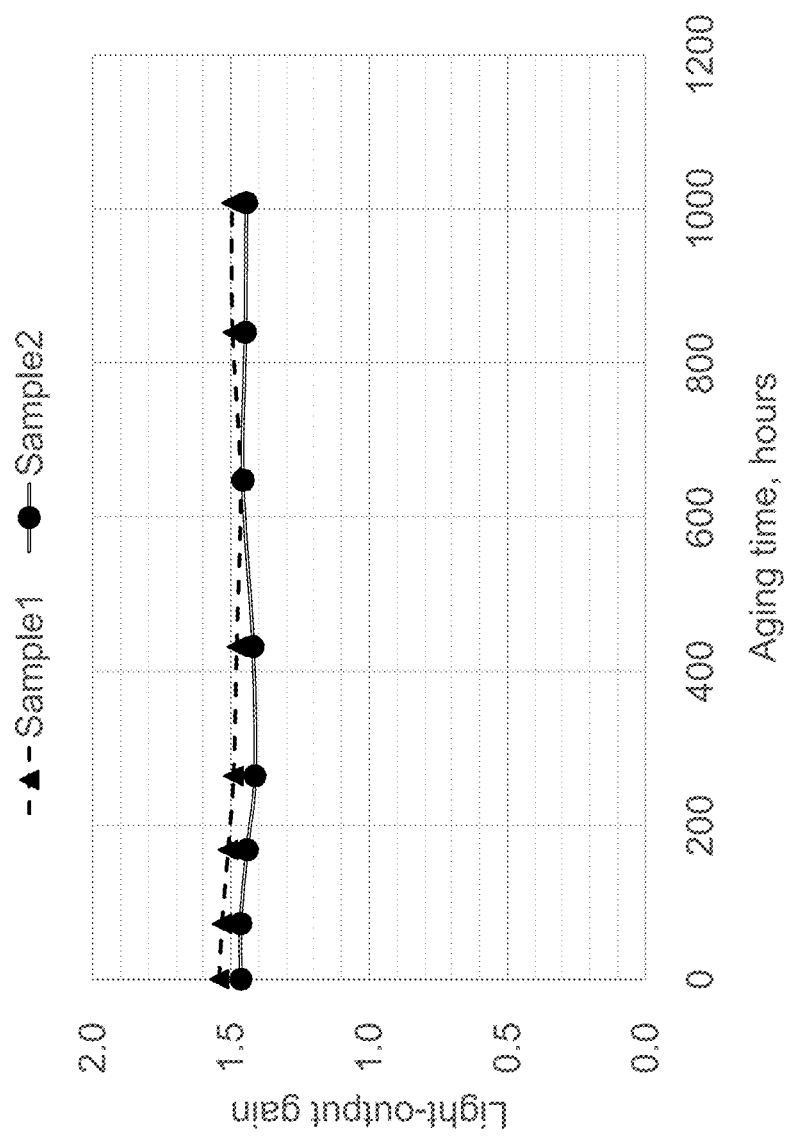
FIG. 4 plots reliability data of two deep UV LED packages according to this disclosure.

The encapsulate (80) made of Krytox GPL 107 oil and the dome-shaped quartz lens (100) can help to extract light out of DUV LED chip (50). Define the ratio of the light output power of a packaged LED to its unpackaged LED chip as light output gain and the gain is usually larger than 1. As shown in FIG. 4, this package's initial light output gain was measured to be between 1.46 to 1.54 times. After 1008 hours continuous 350 mA stressing, the package's light output gain was still in the range of 1.44 to 1.50 times. These numbers (1.46 vs 1.44, 1.54 vs 1.50) could be within our measurement error. If taking the difference as decay due to package aging under strong DUV radiation (experienced DUV dosage as high as $3.63\times10^{10}$ mJ/cm$^2$), these numbers mean that after 1008 hours the package's light-output gain only decreased by 1.4 to 2.6%. As such, a robust, long lifetime DUV LED package technology is enabled by the present disclosure.

Figure 5A:
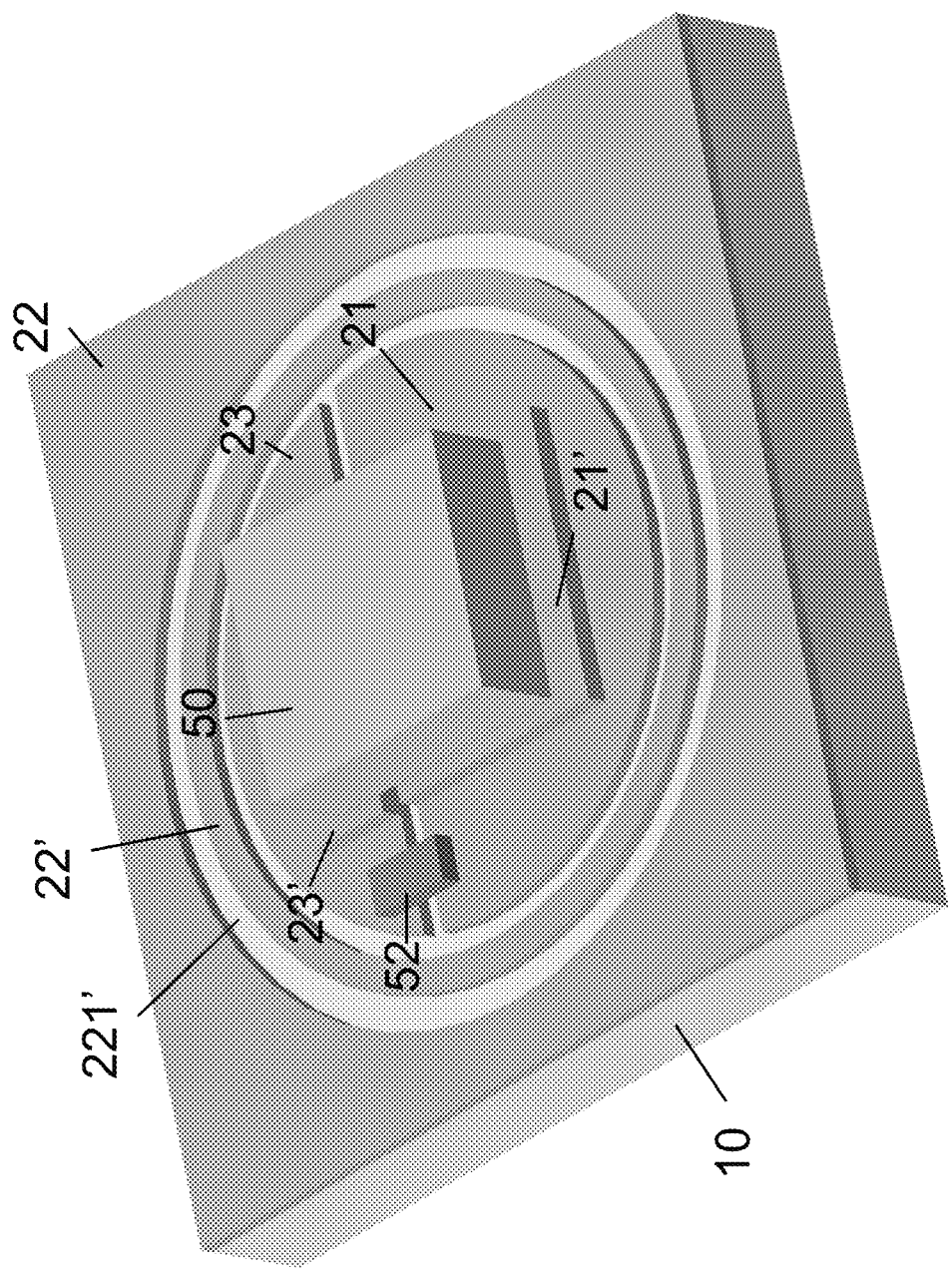
FIG. 5A shows a top perspective view of a LED package including a bare deep UV LED chip mounted on a submount according to another aspect of this disclosure.
Figure 5B:
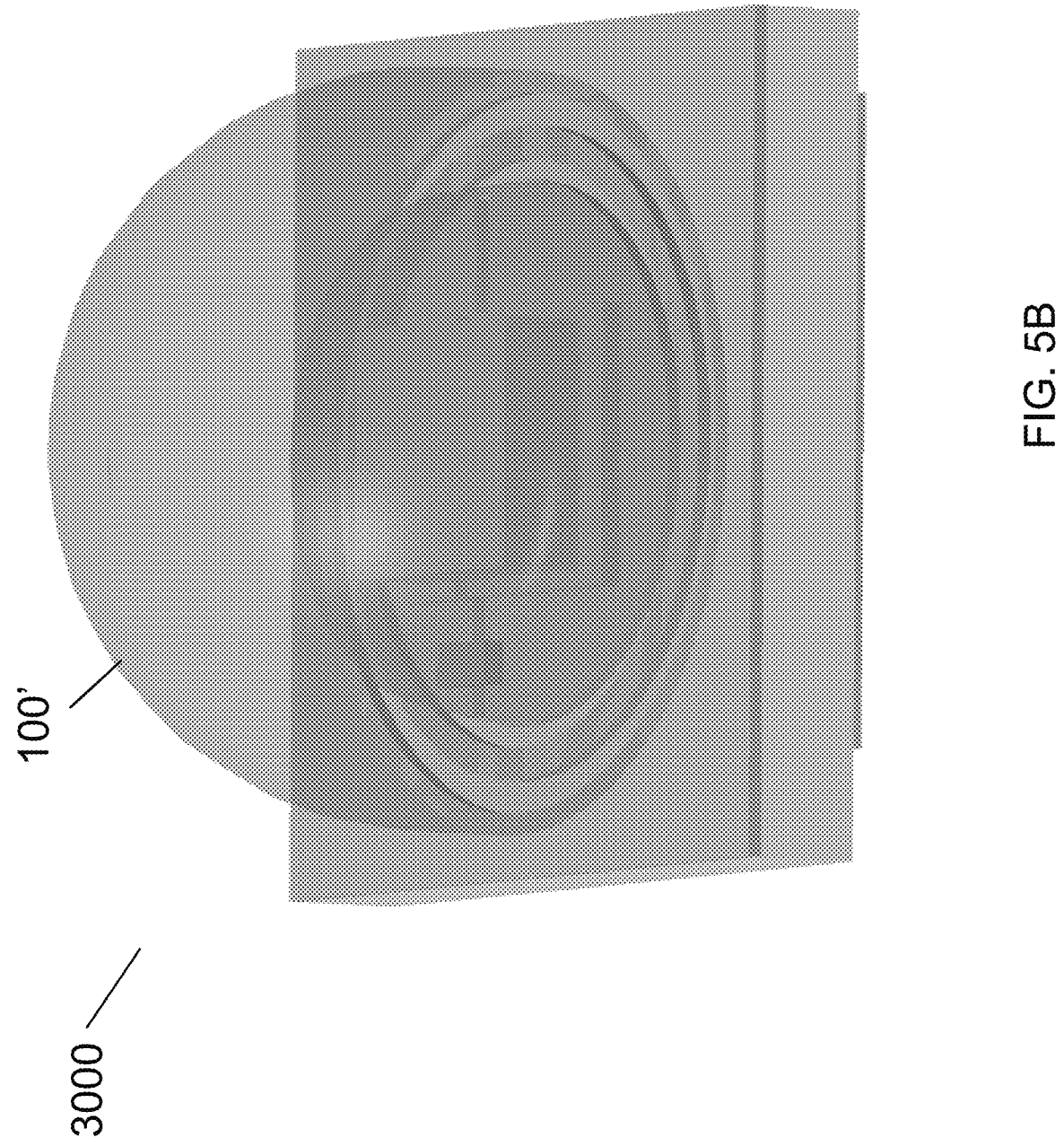
FIG. 5B shows a top perspective view of a deep UV LED including the LED package shown in FIG. 5A capped with a lens.

FIGS. 5A-5C show detailed structure of DUV LED 3000 according to another aspect of this disclosure. As seen, DUV LEDs 3000 has no metal pedestal (60) and braces (90). Instead, lens 100' has a recess 1003' to enclose DUV LED chip 50 and ESD diode 52 and provide transparency and hermiticity for the LED.

DUV LED 3000 includes three main components: submount 10, DUV LED chip 50 and lens 100'. Formed on a top surface of submount 10 are metal layers 21, 22, 22', and 23, metal layers 21 and 23 are separated and electrically isolated from each other by a gap formed in-between them. metal layers 21' and 23' are formed on metal layers 21 and 23, respectively. Formed between metal layers 22 and 22' is a notch 221', which can be deep enough to electrically isolate metals layers 22 and 22', for example, notch 221' exposes the top surface of submount 10 and completely separates metals layers 22 and 22' (as shown in FIG. 5A). Notch 221' can also allow metal connection between metal layers 22 and 22', i.e., at least a portion of notch 221' does not expose the top surface of submount 10. In the embodiment shown in FIGS. 5A-5C, metal layer 22' surrounds metal layers 21 and 23, metal layer 22 surrounds metal layer 22' with metal layer 22' being of an annular shape. Metal layers 21, 22, 22', and 23 can be of the same composition and thickness, for example, they can be a 50-100 μm thick (such as 65 μm) metal layer made of copper, gold tin, or gold layer. In one embodiment, metal layers 21, 22, 22', and 23 are formed via electroplating, made of 65 μm copper coated with 4 μm nickel and about 100 nm gold. The gaps formed in-between them can be of a width 60-150 μm, such as 100 μm, and a height the same as the thickness of the metal layers. Further, respectively formed on metal layers 21 and 23 are metal plateaus 21' and 23'. Metal plateaus 21' and 23' can be of a height of 70-150 μm and size big enough to fully accommodate and receive the anode and cathode of DUV LED chip 50, respectively. Metal layers 21 and 23, metal plateaus 21' and 23' respectively serve as anode and cathode, to receive (contact) the anodes and cathodes of ESD diode 52 and DUV LED chip 50. As DUV LED chip sits on metal plateaus 21' and 23' while ESD diode 52 sits on metal layers 21 and 23, light emitted horizontally from the chip can avoid absorption by ESD diode 52, which is usually about 70-150 μm thick. For this purpose, the thickness of metal plateaus 21' and 23' can be made equal to or larger than that of ESD diode 52.

Metal layers 22, 22' and notch 221' can be used to bond lens 100' using lens attachment Lens attachment 70 can be applied on the top surface of metal layers 22, 22', especially in notch 221'. When a force is exerted to lens 100' towards submount 10, lens attachment 70 will be compressed and spreads out uniformly within notch 221' to provide adhesion and hermicity for the LED package. Upon curing, lens attachment 70 will secure lens 100' hermetically on metal layers 22 and 22' hence on submount 10. Notch 221' helps to spread out lens attachment more uniformly and enhance the mechanical strength and hermeticity as the part of lens attachment 70 in notch 221' is thicker and more stretchable.

Formed on the opposing surface (bottom surface) of submount 10 are metal contacts 31-33, and formed on metal contacts 31-33 are bond pads 41-43 pads. Metal pads 41 and 43 are electrically connected to metal layers 21 and 23, respectively, via metal contacts 31 and 33, and metal through vias formed in submount 10 (refer to FIG. 1F). Metal pads 41-43 are to be soldered to a circuit board, can be made of copper, gold tin, gold, or tin, of a thickness 150-350 μm, such as 260 μm. In one embodiment, metal pads 41-43 are formed via electroplating, made of 265 μm copper coated with 4 μm nickel and about 100 nm gold (gold on top surface as protection). Metal pads 41-43 are electrically isolated from each other by gaps of a width 100-300 μm, such as 270 μm. Metal pad 42 is not biased, serving as a thermal pad to conduct heat.

Lens 100' is substantially rigid (solid), has part being of spherical shape and possesses a recess 1003' in its base portion. Recess 1003' is formed via removal of lens material in the lens base portion, optionally large enough to receive and enclose DUV LED chip 50 and ESD diode 52. For example, when the DUV LED chip 50 is of dimensions of 1.2 mm×1.2 mm×0.4 mm, the lens 100' can be a hemisphere of diameter 3.5 mm, and the recess 1003' can be of dimensions 2.0 mm×2.0 mm×0.5 mm. As a rule of thumb, the diameter of the lens hemispherical portion needs to be at least two times, optionally 2.5-4 times, of the lateral dimension of the DUV LED chip. Lens 100' can be made of DUV transparent materials such as fused silica, quartz, sapphire, AlN, CYTOP, and TEFLON amorphous fluoropolymer et al.

A thin layer of encapsulate 80', such as 1-100 μm thick, can be formed on the top surface of DUV LED chip 50. In one embodiment, encapsulate 80' is air-gap-free, bubble-free, and fills up the entire space in-between the top surface of UVC LED chip 50 and lens 100'. The rest of the space between DUV LED chip 50 and recess 1003' can be fully or partially filled with encapsulate 80', or fully or partially filled with a filler other than encapsulate 80' such as air, nitrogen, argon. Encapsulate 80' can be made of the same materials as encapsulate 80, as described previously related to DUV LED 1000. For example, it can be perfluoropolyether (PFPE) oils or greases such as Fomblin Y LVAC and HVAC grade oils/greases, Krytox oils GPL 107 and XP1A7, et al. Encapsulate 80' is preferred to be of large viscosity (optionally in the range of 100-2000 cSt at 20° C.), suitable surface tension (optionally in the range of 10-100 dyne/cm at 20° C.), and small vapor pressure (optionally in the range of $10^{-4}$-$10^{-8}$ torr at 100° C.). These properties ensure the encapculate's longtime stability and uniform formation in the narrow capillary gap (1-100 μm) between the top surface of UVC LED chip 50 and the top inner surface of recess 1003' of lens 100'. Encapsulate 80' can also be PFPE oil doped with nanoparticles (50-200 nm) of $SiO_2$, $Al_2O_3$, $MgF_2$, $CaF_2$, TEFLON AF, amorphous fluoropolymer CYTOP, et al, of particle volume concentration 3-20 vol. %.

DUV LED 3000 shown in FIGS. 5A-5C offers a simple solution for superior transparency, hermeticity, durability, optical and thermal efficiency.

Furthermore, as seen from FIGS. 5A-5C, variants of DUV LED 3000 can be realized by modifying the shape of lens 100'. In one embodiment, lens 100' can have a cylindrical base portion and recess 1003' is formed within the cylindrical base portion. In another embodiment, the hemispherical portion can be replaced by part of a spheroid or ellipsoid portion.

Figure 6:
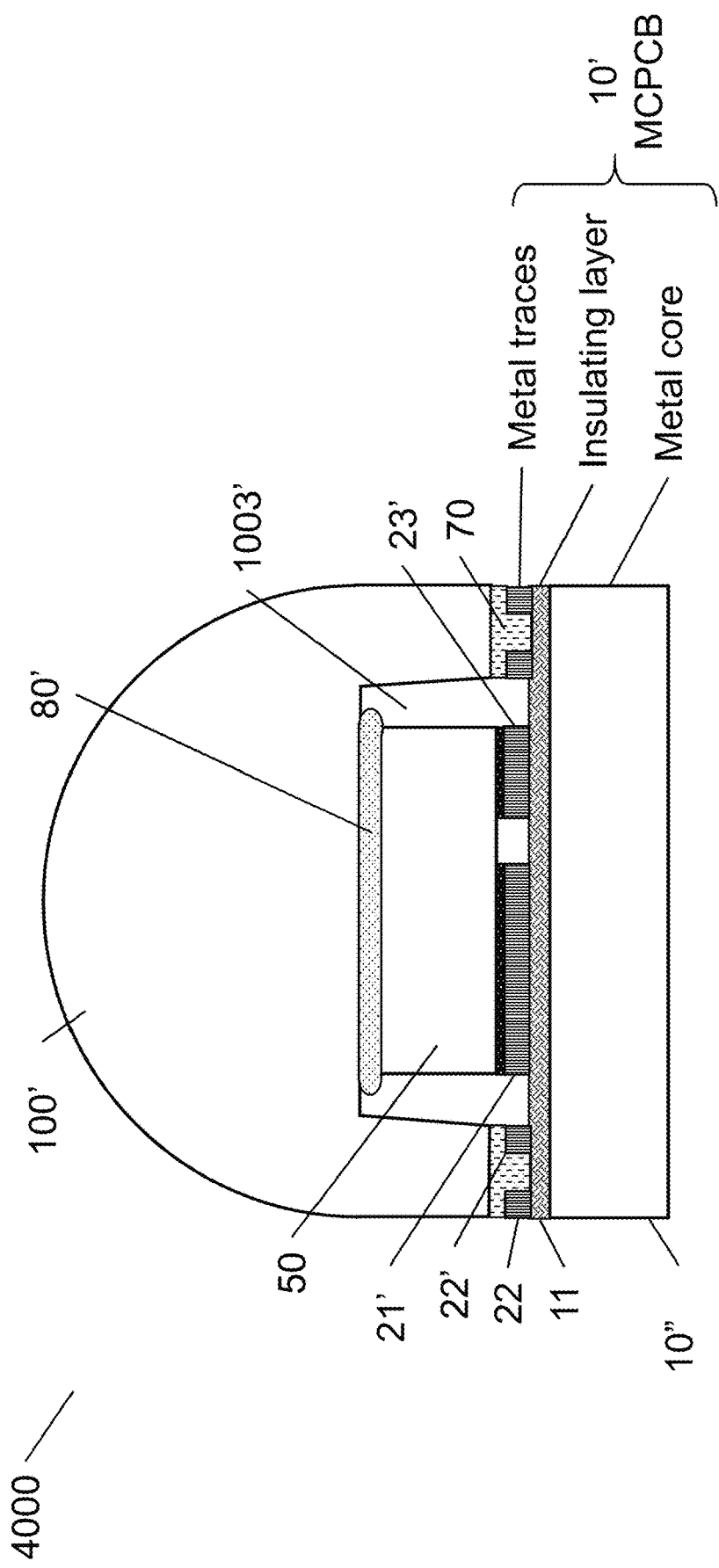
FIG. 6 shows a cross-sectional illustration of a LED package formed on a printed circuit board according to another aspect of this disclosure.

The above embodiments are described based on SMD type LEDs. The same teachings and principles can be applied to chip-on-board (COB) LEDs. Shown in FIG. 6 is another embodiment according to the present disclosure, a flip-chip bonded LED package to a printed circuit board (PCB). As seen from FIG. 6, DUV LED 4000 is similar to DUV LED 3000, only with differences lying in the PCB and surface mount lead frame. Therefore, the description related to DUV LED 3000 and other embodiments given above can be largely applied to DUV LED 4000. The PCB used can be of any type of PCB, here for the sake of good thermal conductance, a metal core printed circuit board (MCPCB) 10' is used, having three main components: metal traces (including metal layers 21-23, 21'-23'), insulating layer 11, and metal body 10". Metal traces are formed on top of insulating layer 11 which electrically isolates the metal traces from the metal body 10". Insulating layer 11 can be made of insulating epoxy, or fiberglass (such as FR4, a Flame Retardant insulator). To briefly reiterate here, DUV LED chip 50 and ESD diode 52 are flip-chip bonded on to the respective metal traces (anodes and cathodes) on MCPCB 10', and lens 100' is hermetically bonded to MCPCB 10' (on metal layers 22, 22' and notch 221') via lens attachment 70, to enclose DUV LED chip 50 and ESD diode 52. A thin layer of encapsulate 80', such as 1-100 μm thick, can be formed on the top surface of DUV LED chip 50. encapsulate 80' is optionally air-gap-free, bubble-free, and fills up the entire space in-between the top surface of UVC LED chip 50 and lens 100'. The rest of the space between DUV LED chip 50 and recess 1003' can be fully or partially filled with encapsulate 80', or fully or partially filled with a filler other than encapsulate 80' such as air, nitrogen, argon. DUV LED 4000 shown in FIG. 6 offers a simple solution for superior transparency, hermeticity, durability, optical and thermal efficiency.

The present invention has been described using exemplary embodiments. However, it is to be understood that the scope of the present invention is not limited to the disclosed embodiments. On the contrary, it is intended to cover various modifications and similar arrangement or equivalents which can be obtained by a person skilled in the art without creative work or undue experimentation. The scope of the claims, therefore, should be accorded the broadest interpretation so as to encompass all such modifications and similar arrangements and equivalents.

What is claimed is:

1. A light-emitting diode package comprising:
 a foundation;
 a first metal layer, a second metal layer, and third metal layer formed on a top surface of the foundation, wherein the first metal layer and the second metal layer are electrically isolated by a first gap, the third metal layer surrounds the first and second metal layers and is electrically isolated from the first and second metal layers by a second gap;
 a metal pedestal with a central opening, wherein a bottom surface of the metal pedestal is attached to the third metal layer;
 a lens attached to a top surface of the metal pedestal, wherein the foundation, the metal pedestal and the lens together define a cavity;
 a chip disposed in the cavity and enclosed by the metal pedestal, wherein an anode of the chip is electrically connected to the first metal layer and a cathode of the chip is electrically connected to the second metal layer;
 a fluid encapsulate, wherein the cavity is fully or partially filled with the fluid encapsulate; and
 a gasket with a central opening, wherein a notch is formed on a top surface of the gasket, the top surface of the gasket is attached to the lens and a bottom surface of the gasket is attached to the top surface of the metal pedestal, and the central opening of the gasket is aligned with the central opening of the metal pedestal.

2. The light-emitting diode package of claim 1, wherein the liquid encapsulate has a viscosity in the range of 100-2000 cSt at 20° C., a surface tension in the range of 10-100 dyne/cm at 20° C. and a vapor pressure in the range of $10^{-4}$-$10^{-8}$ torr at 100° C., and is UV transparent.

3. The light-emitting diode package of claim 1, wherein the liquid encapsulate comprises perfluoropolyether (PFPE) oil with a chemical formula:

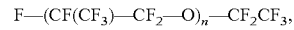

$$F—(CF(CF_3)—CF_2—O)_n—CF_2CF_3,$$

where n lies within the range of 10 to 60; or
the PFPE oil doped with nanoparticles selected from $SiO_2$, $Al_2O_3$, $MgF_2$, $CaF_2$, polytetrafluoroethylene (PTFE), and amorphous fluoropolymer with a volume concentration of 3-20%.

4. The light-emitting diode package of claim 1, wherein the cavity is hermetic.

5. The light-emitting diode package of claim 1, wherein an inner sidewall of the central opening of the metal pedestal is slanted at an angle to reflect light emitted from an edge of the chip towards to a predetermined direction, and a notch is formed on the top surface of the metal pedestal.

6. The light-emitting diode package of claim 1, wherein a groove is formed on the bottom surface of the gasket and continuously surrounds the central opening and, within the groove, segmented areas with a narrower width than that of the groove open to the top surface of the gasket.

7. The light-emitting diode package of claim 1, wherein the chip is an ultraviolet (UV) light-emitting diode chip or a deep ultraviolet (DUV) light-emitting diode chip.

8. The light-emitting diode package of claim 1, wherein the foundation is a submount or a print circuit board.

9. The light-emitting diode package of claim 1, wherein the metal pedestal is made of copper coated with aluminum.

10. The light-emitting diode package of claim 1, wherein the bottom surface of the metal pedestal is directly attached to the third metal layer.

11. The light-emitting diode package of claim 1, wherein the top surface of the metal pedestal is attached to the lens using a lens attachment, the lens attachment is an elastomer capable of being reversibly extended more than 10% upon exertion or relaxation of an external force.

12. The light-emitting diode package of claim 11, wherein the lens attachment comprises polydimethylsiloxane.

13. The light-emitting diode package of claim 1, wherein the lens is attached to the third metal layer using a lens attachment.

14. The light-emitting diode package of claim 13, wherein a notch is formed on a top surface of the third metal layer, the notch does not penetrate the third metal layer in a thickness direction, or completely penetrates the third metal layer and divides the third metal layer into two metal layers isolated from each other.

15. The light-emitting diode package of claim 13, wherein the lens attachment is an elastomer capable of being reversibly extended more than 10% upon exertion or relaxation of an external force.

16. The light-emitting diode package of claim 13, wherein the lens comprises a recess, the chip is accommodated in the recess, and a space between a top surface of the chip and a top inner surface of the recess is fully filled by the fluid encapsulate.

17. The light-emitting diode package of claim 13, further comprising a first metal plateau and a second metal plateau electrically isolated from each other and formed on the first metal layer and second metal layer, respectively, the chip is disposed on the first and second metal plateaus with the anode of the chip connected to the first metal plateau and the cathode of the chip connected to the second metal plateau.

18. The light-emitting diode package of claim 17, further comprising an electrostatic discharge diode disposed on the first and second metal layers, wherein an anode of the electrostatic discharge diode is connected to the first metal layer and a cathode of the electrostatic discharge diode is connected to the second metal layer.

19. A light-emitting diode package comprising:
a foundation;
a first metal layer, a second metal layer, and third metal layer formed on a top surface of the foundation, wherein the first metal layer and the second metal layer are electrically isolated by a first gap, the third metal layer surrounds the first and second metal layers and is electrically isolated from the first and second metal layers by a second gap;
a lens attached to the top surface of the foundation, wherein a cavity is formed between the foundation and the lens;
a chip disposed in the cavity, wherein an anode of the chip is electrically connected to the first metal layer and a cathode of the chip is electrically connected to the second metal layer; and
a fluid encapsulate, wherein the cavity is fully or partially filled with the fluid encapsulate;
a pedestal with a central opening, wherein a bottom surface of the pedestal is attached to the third metal layer and a top surface of the pedestal is attached to the lens, so that the foundation, the lens and the pedestal together define the cavity with the pedestal enclosing the chip;
an inner sidewall of the central opening of the pedestal is slanted at an angle to reflect light emitted from an edge of the chip towards to a predetermined direction, and a notch is formed on the top surface of the pedestal.

20. A light-emitting diode package comprising:
a foundation;
a first metal layer, a second metal layer, and third metal layer formed on a top surface of the foundation, wherein the first metal layer and the second metal layer are electrically isolated by a first gap, the third metal layer surrounds the first and second metal layers and is electrically isolated from the first and second metal layers by a second gap;
a lens attached to the top surface of the foundation, wherein a cavity is formed between the foundation and the lens;
a chip disposed in the cavity, wherein an anode of the chip is electrically connected to the first metal layer and a cathode of the chip is electrically connected to the second metal layer; and
a fluid encapsulate, wherein the cavity is fully or partially filled with the fluid encapsulate;
wherein the lens is attached to the third metal layer using a lens attachment, and a notch is formed on a top surface of the third metal layer, the notch does not penetrate the third metal layer in a thickness direction, or completely penetrates the third metal layer and divides the third metal layer into two metal layers isolated from each other.

21. The light-emitting diode package of claim 20, wherein the liquid encapsulate comprises perfluoropolyether (PFPE) oil with a chemical formula:

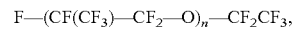

where n lies within the range of 10 to 60; or
the PFPE oil doped with nanoparticles selected from $SiO_2$, $Al_2O_3$, $MgF_2$, $CaF_2$, polytetrafluoroethylene (PTFE), and amorphous fluoropolymer with a volume concentration of 3-20%.

22. The light-emitting diode package of claim 20, wherein the lens comprises a recess, the chip is accommodated in the recess, and a space between a top surface of the chip and a top inner surface of the recess is fully filled by the fluid encapsulate.

23. The light-emitting diode package of claim 20, further comprising a first metal plateau and a second metal plateau electrically isolated from each other and formed on the first metal layer and second metal layer, respectively, the chip is disposed on the first and second metal plateaus with the anode of the chip connected to the first metal plateau and the cathode of the chip connected to the second metal plateau.

24. The light-emitting diode package of claim 20, wherein the chip is an ultraviolet (UV) light-emitting diode chip or a deep ultraviolet (DUV) light-emitting diode chip.

25. The light-emitting diode package of claim 20, wherein the foundation is a submount or a print circuit board.

* * * * *